United States Patent [19]
Azuma

[11] Patent Number: 5,879,853
[45] Date of Patent: Mar. 9, 1999

[54] TOP ANTIREFLECTIVE COATING MATERIAL AND ITS PROCESS FOR DUV AND VUV LITHOGRAPHY SYSTEMS

[75] Inventor: Tsukasa Azuma, Poughkeepsie, N.Y.

[73] Assignee: Kabushiki Kaisha Toshiba, Kawasaki, Japan

[21] Appl. No.: 588,085

[22] Filed: Jan. 18, 1996

[51] Int. Cl.$^6$ ............................ G03F 7/023; G03C 1/825
[52] U.S. Cl. .................. 430/166; 430/270.1; 430/512
[58] Field of Search .................................. 430/192, 193, 430/165, 166, 512, 270.1

[56] References Cited

U.S. PATENT DOCUMENTS

| | | | |
|---|---|---|---|
| 4,246,374 | 1/1981 | Kopchik | 525/329 |
| 4,524,121 | 6/1985 | Gleim et al. | 430/176 |
| 4,565,769 | 1/1986 | Dueber et al. | 430/281 |
| 4,837,124 | 6/1989 | Wu et al. | 430/270 |
| 4,942,112 | 7/1990 | Monroe et al. | 430/282 |
| 5,126,289 | 6/1992 | Ziger | 437/231 |
| 5,397,684 | 3/1995 | Hogan et al. | 430/313 |
| 5,401,614 | 3/1995 | Dichiara et al. | 430/323 |
| 5,439,774 | 8/1995 | Iwasawa et al. | 430/190 |

*Primary Examiner*—John S. Chu
*Attorney, Agent, or Firm*—Banner & Witcoff

[57] ABSTRACT

This invention relates to a top antireflective layer (TAR) which is preferably transparent to some extent and has high-etch resistance and low reflectivity at the photoresist/TAR interface. The TAR also significantly reduces CD variation in exposed photoresist film. The TAR of the present invention comprises an indanone or glutarimide copolymer, a solvent, and an additive sensitizer having an orthodiazonaphthoquinone structure. The present invention is also related to a process of forming a semiconductor by applying a photoresist layer to the surface of a substrate, forming a top antireflection layer on the photoresist layer, and selectively exposing the substrate to ultraviolet light, wherein the TAR comprises an indanone or glutarimide copolymer, a solvent, and an additive sensitizer with an orthodiazonaphthoquinone structure.

5 Claims, No Drawings

TOP ANTIREFLECTIVE COATING MATERIAL AND ITS PROCESS FOR DUV AND VUV LITHOGRAPHY SYSTEMS

This invention relates generally to optical projection illumination systems and, more particularly, to a top antireflective coating for use in a lithography system.

BACKGROUND OF THE INVENTION

In the manufacture of a semiconductor, a layer of photoresist may be applied directly to the surface of a substrate or to layer(s) already on the surface of the substrate. A portion of the photoresist is then exposed to u.v. light to form a pattern on the photoresist. Then a solvent is applied to remove either the exposed or unexposed photoresist as desired.

Light scattering or interference caused by light reflecting off the substrate, for example, causes a dimension change in the exposed region of the photoresist layer. In other words, the desired dimensions of the exposed photoresist layer are altered by the light reflecting off the surface of the substrate. In some semiconductors small variations in the desired dimensions may be acceptable. However, there is usually a point in which no further variation can be tolerated because such variation alters the desired characteristics and performance of the semiconductor. The point at which no further variation can be tolerated is called the critical dimension ("CD").

In lithography systems, thin film interference effects result in less controllability of CD and less accurate alignment. These problems are more significant for illumination light having a short wavelength, e.g., 248 nm of a KrF excimer laser and 193 nm of an ArF excimer laser.

Two solutions to suppress thin film interference and reduce light scattering are bottom antireflective coatings (BARLs) and top antireflective coatings (TARs). A BARL is usually applied to a substrate and baked prior to applying the photoresist layer. After the photoresist layer is applied, patterns are resolved in the photoresist by DUV light in the case of the practical BARL process. Then, the photoresist patterns are transferred to both the BARL and the substrate by reactive ion etching (RIE) continuously. After the pattern transfer, both the desired photoresist and BARL portions are removed. Accordingly, the BARL must be more effective to reduce light scattering or interference caused by light reflecting off the substrate due to the higher light absorption. However, there are few available BARLs to completely suppress the light scattering or interference without reducing alignment light.

A TAR is usually spun onto the applied photoresist and baked. Patterns are resolved in both the TAR and the photoresist by DUV light simultaneously. The TAR portions are usually removed by the solvent (developer) completely, in the case of the practical TAR process. Then, the photoresist patterns are transferred to the substrate to RIE. After the pattern transfer, the desired photoresist portions are removed. Accordingly, the TAR must be transparent to some extent to let both incident light and light reflecting off the substrate go off. However, it has been difficult to obtain a TAR layer which has a suitable index of refraction for the wavelength of the illumination light and no contamination on the interface between the underlayer resist and the TAR itself.

In advanced lithography, it is well known that a reduction of photoresist thickness induces imagings of decreased $k_1$ factor and increased $k_2$ factor in conventional Rayleigh equations simultaneously without changing any wavelengths of the illumination light and numerical apertures of the optics. On the other hand, it causes more serious thin film interference effects and requires a higher etch selectivity ratio. In order to restore such concomitant problems using a conventional single layer resist technique, either of the photoresist or the TAR is required to have higher etch resistance than previously expected.

SUMMARY OF THE INVENTION

The TAR layer of the present invention has a suitable index of refraction for the wavelength of the illumination light and no contamination on the interface between the underlayer resist and the TAR itself. The present invention provides a top antireflective coating material with higher etch resistance. The TAR also significantly reduces CD variation in exposed photoresist film.

The present invention is particularly directed to a TAR comprising an indanone or glutarimide copolymer, a solvent, and an additive sensitizer with an orthodiazonaphthoquinone structure.

The present invention is also directed to a process for producing a semiconductor comprising applying a resist layer to a substrate and then applying a top antireflection layer to the surface of the resist layer, and selectively exposing the substrate to ultraviolet light, wherein the antireflective layer comprises an indanone or glutarimide copolymer, a solvent, and an additive sensitizer with an orthodiazonaphthoquinone structure.

It is to be understood that both the foregoing general description and the following detailed description are exemplary and explanatory only and are not restrictive of the present invention as claimed.

DETAILED DESCRIPTION OF THE INVENTION

The TAR material of the present invention comprises an indanone or glutarimide copolymer, a solvent which has no intermixing with the underlayer resist, and an additive sensitizer with an orthodiazonaphthoquinone structure. The mixture of naphthyl and cyclohexyl structures of the sensitizer has both suitable refractive index for wavelengths of illumination light, such as 193 and 248 nm, and excellent etch resistance.

The copolymer is produced by combining indanone or glutarimide with an acrylate or methacrylate, vinyl, olefin, epoxy, or an alcohol.

Examples of preferred copolymers include 1–7 below.

1) copolymer of methylmethacrylate and indanone;

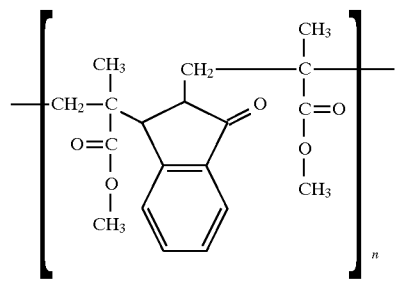

2) copolymer of vinyl and indanone;

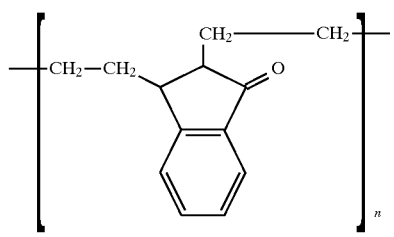

3) copolymer of olefin and indanone;

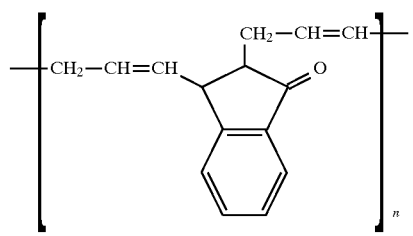

4) copolymer of epoxy and indanone;

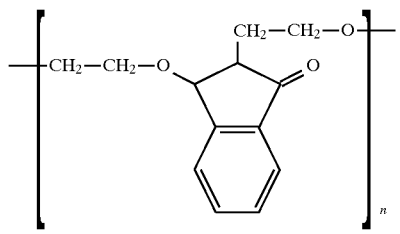

5) copolymer of vinyl and glutarimide;

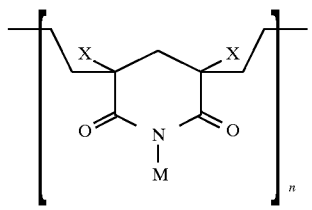

where X=H or CH$_3$ and m=H, CH$_3$ or C$_2$H$_5$.

6) copolymer of olefin and glutarimide

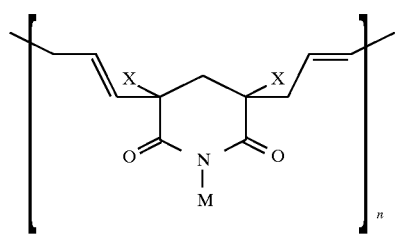

where X=H or CH$_3$ and m=H, CH$_3$ or C$_2$H$_5$.

7) copolymer of epoxy and glutarimide

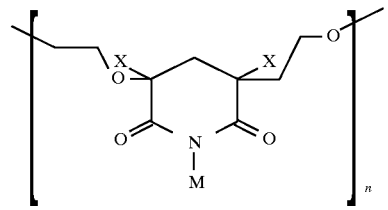

where X=H or CH$_3$ and m=H, CH$_3$ or C$_2$H$_5$.

The amount of copolymer is used to provide an appropriate TAR on the photoresist and is within the skill of the art.

The solvent may also be any solvent suitable to prepare TARs, including, but not limited to, water, methanol, ethanol, or other aqueous solution so long as there is no intermixing with the photoresist layer.

The amount of solvent is added to dissolve the polymer and is within the skill of the art.

A sensitizer may be added to the polymer and solvent mixture to provide a suitable refractive index and etch resistance. Suitable sensitizers include those having an orthodiazonaphthoquinone structures selected from the following structures:

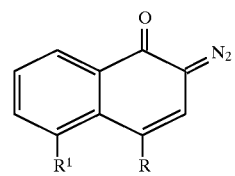

1)

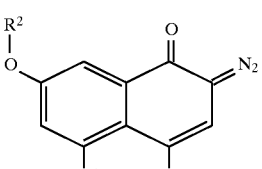

2)

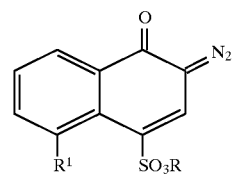

3)

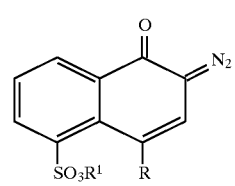

4)

wherein each of the formulas above, R, R$^1$, and R$^2$, is hydrogen, methyl, or ethyl.

Other additives may be added to the TAR in any manner known to skilled practitioner so long as the desired characteristics of the TAR is maintained. For instance, a small amount of surfactant, such as a fluorinated ester, may be added. Any amount effective as a surfactant is contemplated.

The present invention may be used with various combinations of known substrates having various film layers. The resist may be applied to the substrate or to any desired layer between the substrate and TAR layer. A BARL may also be used.

To simplify the description of the present invention, a process to prepare a simple semiconductor will be discussed. It is to be understood that other processes and layer combinations are within the scope of the present invention. For example, a semiconductor may be prepared with a first photoresist-TAR combination, and after forming the desired oxide pattern and removing the photoresist and TAR strip, a second oxide film may be formed and a second TAR-photoresist-TAR combination formed to form a desired pattern in the second oxide film.

The substrate may be any conventional substrate suitable for photo-lithography. Examples of suitable substrates include silicon, polysilicon, germanium, nitride, metals and the like.

The photoresist may be conventional DUV (deep ultra violet) or VUV (vacuum ultraviolet) positive-type or negative-type underlayer resist. Suitable photoresists include APEX-E which is a commercially available DUV photoresist sold by IBM. Suitable VUV photoresists include polymethylmethacrylate (PMMA) and polymethylisopropenyl ketone (PMIPK).

The photoresist is then baked to achieve evaporation of photoresist solvents to promote adhesion.

A TAR is formed over the photoresist layer. The TAR of the present invention is formed by combining an indanone or glutarimide copolymer, a solvent and an additive sensitizer with an orthodiazonaphthoquinone structure. Any method of combining the copolymer, solvent and sensitizer to provide a composition suitable for coating the substrate is contemplated by the inventors.

The TAR material preferably has a refractive index of $n_1 = a - bi$, where a is the real unit employing $a \approx c^{1/2}$, b is the imaginary unit employing $b \approx d/2$. The TAR thickness, t, is preferably $t = \lambda/4a$.

$n_1$: a refractive index of the TAR of the present invention with $n_1 = a - bi$, where a is the real unit number and b is the imaginary unit number. (a is about 1.4 to 1.5 and b is about 0.01 to 0.02.)

$n_2$: a refractive index of the underlayer resist for DUV and VUV lithography with $n_2 = c - di$, where c is the real unit number and d is the imaginary unit number. (c is about 1.7 to 1.8 and d is about 0.02 to 0.03.)

i: imaginary number $\lambda$: a wavelength of the illumination light

For example purposes only, a DUV ($\lambda = 248$ nm) resist APEX-E has $n_2 = 1.757 - 0.009i$. In this case, the TAR would have an a value of about 1.3 to 1.4, a b value of about 0.005 and a t value of about 50 nm.

The TAR of the present invention can be prepared in any appropriate manner. For example, it may be prepared by dissolving the copolymer in the solvent and then adding the sensitizer. The solution is then stirred by conventional techniques such as in an ultrasonic bath. Other dispersion methods may be used such as a gas evaporation method.

A preferred conventional method for forming a TAR is spin casting, but any coating method known to coat layers on a desired surface in any manner to produce a TAR is contemplated.

Any suitable thickness which provides the desired TAR coating can be used and is within the skill of the art. The thickness of the TAR is preferably less than about 1000 Å, more preferably less than about 500 Å. Etch bias during TAR etch is minimized by minimizing the thickness of the TAR.

Methods to coat, bake, expose and develop photoresist layers are known to skilled practitioners and well within the skill of the art.

The TAR is then etched in any manner known by skilled artisans. The photoresist and TAR may be etched together or separately. A typical, but not limiting, example of an appropriate etching material is a combination of $CF_4$, Ar and $O_2$.

The photoresist and TAR strip remaining over the substrate are then removed by conventional techniques known by the skilled artisan, for example by plasma ashing or a wet process using $H_2SO_4$ and $H_2O_2$. The photoresist and TAR strip may be removed together or separately as desired.

The TAR material provides not only full suppression of the thin film interference effects, but significant improvement of etch (RIE) resistance, even in cases of using thin resist and non-aryl resin-type resist.

EXAMPLES

The invention will be further described by reference to the following examples. These examples should not be construed in any way as limiting the invention.

The following is a nonlimiting examples of preparing an TAR on a semiconductor in accordance with the present invention. Other means of providing a TAR on a semiconductor are within the skill of the art.

Example 1

Preparation of a positive-type underlayer resist (1) optionally, coat a BARL on a substrate and bake;
(2) coat a positive-type underlayer resist on the BARL or substrate and bake;
(3) coat a TAR material on the resist and bake (post apply bake—"PAB");
(4) optionally, immerse the coated substrate in a tetramethyl ammonium hydrige (TMAH) aqueous solution;
(5) expose the substrate to 248 nm (KrF) or 193 nm (ArF) exposure;
(6) develop the TAR material using TMAH aqueous solution;
(7) optionally, flood exposure using UV (g- or i-line) illumination light;
(8) post exposure bake ("PEB");
(9) develop underlayer resist using TMAH aqueous solution.

Example 2

Preparation of a negative-type underlayer resist (1) optionally, coat a BARL on a substrate and bake;
(2) coat a negative-type underlayer resist on the BARL or substrate and bake;
(3) coat a TAR material on the resist and bake;
(4) optionally, immerse the coated substrate in a TMAH aqueous solution;
(5) expose the substrate to 248 nm (KrF) or 193 nm (ArF) exposure;
(6) PEB;
(7) flood exposure using UV illumination light;
(8) develop underlayer resist using TMAH aqueous solution.

In general, it is well known that immersion of TMAH on the surface including orthodiazonaphthoquinone structures induces an "azo-coupling" reaction. Then, just the thin surface turns insoluble (or hard-to-be soluble). On the other hand, a TAR layer, including an orthodiazonaphthoquinone structure, turns entirely insoluble by UV light exposure and then PEB. This process is called "image reversal," which is a required bake treatment (PEB in this case) with a temperature of more than 110° C. to 120° C.

It will be apparent to those skilled in the art that various modifications and variations can be made in the compositions and methods of the present invention without departing from the spirit or scope of the invention. Thus, it is intended that the present invention cover the modifications and variations of this invention provided they come within the scope of the appended claims and their equivalents.

What is claimed is:

1. A multilayered structure used in manufacturing a semiconductor device comprising:

(a) a photoresist layer; and (b) an antireflective layer formed on the photoresist layer, wherein said antireflective layer comprises an indanone or glutarimide copolymer, a solvent, and an additive sensitizer with an orthodiazonaphthoquinone structure and a thickness of less than 1000 Å.

2. The multilayered structure according to claim 1 wherein the copolymer is indanone.

3. The multilayer structure of claim 1 wherein the solvent is selected from the group consisting of water, methanol, ethanol and other aqueous solutions that do not intermix with the photoresist layer.

4. The multilayer structure of claim 1 wherein the additive sensitizer is selected from the group consisting of

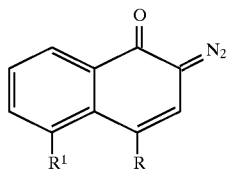

1)

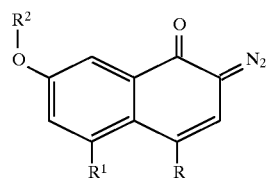

2)

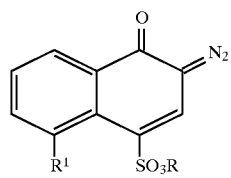

3)

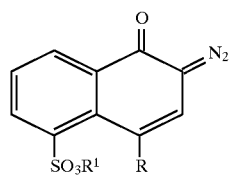

4)

wherein in each of the formulas above, R, $R^1$, and $R^2$ are independently selected from the group consisting of hydrogen, methyl, or ethyl.

5. The multilayer structure of claim 1 wherein the copolymer is produced by combining indanone or glutarimide with an acrylate, a methacrylate, vinyl, olefin, epoxy, or an alcohol.

* * * * *